United States Patent
Tsai et al.

(10) Patent No.: US 9,224,525 B2
(45) Date of Patent: Dec. 29, 2015

(54) OVER-CURRENT PROTECTION DEVICE AND CIRCUIT BOARD STRUCTURE CONTAINING THE SAME

(71) Applicants: Tong Cheng Tsai, Tainan (TW); Wen Feng Lee, Taoyuan (TW); Chun Teng Tseng, Sanwan Township, Miaoli County (TW); Chi Jen Su, Taipei (TW); Yi An Sha, New Taipei (TW)

(72) Inventors: Tong Cheng Tsai, Tainan (TW); Wen Feng Lee, Taoyuan (TW); Chun Teng Tseng, Sanwan Township, Miaoli County (TW); Chi Jen Su, Taipei (TW); Yi An Sha, New Taipei (TW)

(73) Assignee: POLYTRONICS TECHNOLOGY CORP., Hsinchu (TW)

( * ) Notice: Subject to any disclaimer, the term of this patent is extended or adjusted under 35 U.S.C. 154(b) by 211 days.

(21) Appl. No.: 14/017,839

(22) Filed: Sep. 4, 2013

(65) Prior Publication Data
US 2014/0209365 A1 Jul. 31, 2014

(30) Foreign Application Priority Data
Jan. 31, 2013 (TW) .............................. 102103639 A

(51) Int. Cl.
| H05K 1/16 | (2006.01) |
| H05K 7/00 | (2006.01) |
| H01C 7/02 | (2006.01) |
| H01C 1/14 | (2006.01) |
| H05K 1/02 | (2006.01) |
| H05K 1/03 | (2006.01) |
| H05K 1/18 | (2006.01) |

(52) U.S. Cl.
CPC .............. *H01C 7/021* (2013.01); *H01C 1/1406* (2013.01); *H05K 1/0263* (2013.01); *H05K 1/0373* (2013.01); *H05K 1/181* (2013.01); *H05K 2201/10196* (2013.01)

(58) Field of Classification Search
CPC .... H01C 7/021; H01C 1/1406; H05K 1/0263; H05K 1/181; H05K 2201/10196
USPC .......................................... 174/260; 361/760
See application file for complete search history.

(56) References Cited

U.S. PATENT DOCUMENTS

| 5,963,423 | A * | 10/1999 | Ikeda ............................ 361/690 |
| 2002/0170747 | A1* | 11/2002 | Chu et al. ...................... 174/256 |
| 2004/0041683 | A1* | 3/2004 | Tosaka et al. ................ 338/22 R |
| 2004/0218329 | A1* | 11/2004 | Becker et al. ................. 361/106 |
| 2005/0141160 | A1* | 6/2005 | Ma et al. ...................... 361/93.1 |
| 2008/0253050 | A1* | 10/2008 | Yu et al. ....................... 361/93.8 |
| 2008/0265326 | A1* | 10/2008 | Hebert .......................... 257/355 |

\* cited by examiner

*Primary Examiner* — Sherman Ng
(74) *Attorney, Agent, or Firm* — Egbert Law Offices, PLLC

(57) ABSTRACT

An over-current protection device, which can be surface-mounted and stand upright on a circuit board and withstand 60 to 600 volts, comprises a PTC device, first and second electrodes. The PTC device is a laminated structure comprising first and second conductive layers and a PTC material layer. The first and second conductive layers are in physical contact with first and second planar surfaces of the PTC material layer, respectively. The first electrode is disposed on the first conductive layer. The second electrode is disposed on the second conductive layer and is separated from the first electrode. The first electrode, the second electrode and the PTC device commonly form an end surface which is substantially perpendicular to the first and second planar surfaces. The first electrode and the second electrode at the end surface serve as interfaces electrically connecting to the circuit board.

13 Claims, 4 Drawing Sheets

OVER-CURRENT PROTECTION DEVICE AND CIRCUIT BOARD STRUCTURE CONTAINING THE SAME

CROSS-REFERENCE TO RELATED APPLICATIONS

Not applicable.

STATEMENT REGARDING FEDERALLY SPONSORED RESEARCH OR DEVELOPMENT

Not applicable.

NAMES OF THE PARTIES TO A JOINT RESEARCH AGREEMENT

Not applicable.

INCORPORATION-BY-REFERENCE OF MATERIALS SUBMITTED ON A COMPACT DISC

Not applicable.

BACKGROUND OF THE INVENTION

1. Field of the Invention

The present application relates to an over-current protection device, and more particularly to a surface-mountable over-current protection device of high-voltage endurance and a circuit board structure containing the same.

2. Description of Related Art Including Information Disclosed Under 37 CFR 1.97 and 37CFR 1.98

With the popularity of portable electronic gadgets, e.g., cellular phones, laptop computers, digital cameras, and personal digital assistants (PDA), over-current protection devices capable of preventing over-current or over-temperature events in secondary cells or circuit devices are becoming increasingly important.

The resistance of a positive temperature coefficient (PTC) device is very sensitive to temperature variation. The resistance of the FTC device remains extremely low at normal temperature, so that the circuit or cell can operate normally. However, when the PTC device heats up to a critical temperature due to an over-current or an over-temperature event occurring in the circuit or cell, the resistance instantaneously increases to a high resistance state (e.g., at least $10^4 \Omega$), so as to suppress over-current and protect the cell or the circuit device. Therefore, the PTC devices have been widely integrated into various circuitries to avoid over-current damages.

A known traditional SMD over-current protection device for low voltage applications, e.g., less than 32 volts, is small, thin and sophisticated; therefore it uses complex circuit design and is made by PCB processes such as pressing, drilling and copper-plating. As to an over-current protection device of high voltage applications, e.g., larger than 66 volts, it appears relatively large and thick and therefore is suitable for being placed upright or mounted on a circuit board. In order to meet the requirements of high voltage testing, the traditional SMD over-current protection device with compact circuit design may easily induce solder wicking event which causes insufficient isolation, resulting in inferior voltage endurance of the device.

BRIEF SUMMARY OF THE INVENTION

The present application relates to an over-current protection device which can be surface-mounted on a circuit board. The device can be easily made in terms of process and has great voltage endurance performance, and it can avoid short circuit caused by a solder wicking event.

According to a first aspect of the present application, an over-current protection device, which can be surface-mounted and stands upright on a circuit board and withstand 60 to 600 volts, is disclosed. The over-current protection device comprises a PTC device, a first electrode and a second electrode. The PTC device is a laminated structure comprising a first conductive layer, a second conductive layer and a PTC material layer. The PTC material layer has opposite first and second planar surfaces. The first conductive layer is in physical contact with the first planar surface of the PTC material layer, and the second conductive layer is in physical contact with the second planar surface of the PTC material layer. The first electrode is disposed on the first conductive layer. The second electrode is disposed on the second conductive layer and is separated from the first electrode. The first electrode, the second electrode and the PTC device commonly form an end surface which is substantially perpendicular to the first and second planar surfaces. The first electrode and the second electrode at the end surface serve as interfaces electrically connecting to the circuit board.

According to a second aspect of the present application, a circuit board comprising a circuit board and an over-current protection device is proposed. The over-current protection device can withstand 60 to 600 volts and is surface-mounted and stands upright on the circuit board. The PTC device is a laminated structure comprising a first conductive layer, a second conductive layer and a PTC material layer. The PTC material layer has opposite first and second planar surfaces. The first conductive layer is in physical contact with the first planar surface of the PTC material layer, and the second conductive layer is in physical contact with the second planar surface of the PTC material layer. The first electrode is disposed on the first conductive layer. The second electrode is disposed on the second conductive layer and is separated from the first electrode. The first electrode, the second electrode and the PTC device commonly form an end surface which is substantially perpendicular to the first and second planar surfaces and faces the circuit board. The first and second electrodes at the end surface electrically connect to the circuit board.

The over-current protection device uses an unsophisticated design, and can be easily made through printed circuit board (PCB) processes such as solder masking, text-printing, copper-plating, tin-plating and cutting. The device is adaptive to be mounted on the circuit board in an upright position to sustain electrical performances, and can meet the objectives of simplifying processes and cost reduction.

BRIEF DESCRIPTION OF THE SEVERAL VIEWS OF THE DRAWINGS

The present application will be described according to the appended drawings in which.

DETAILED DESCRIPTION OF THE INVENTION

The making and using of the presently preferred illustrative embodiments are discussed in detail below. It should be appreciated, however, that the present application provides many applicable inventive concepts that can be embodied in a wide variety of specific contexts. The specific illustrative embodiments discussed are merely illustrative of specific ways to make and use the invention, and do not limit the scope of the invention.

Figure 1:
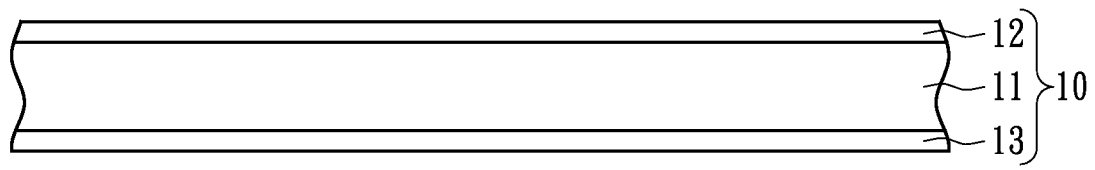
FIGS. 1 to 4 show a process of making a surface-mountable over-current protection devices in accordance with an embodiment of the present application.

FIGS. 1 to 4 show a process of making art over-current protection device in accordance with an embodiment of the present application. In FIG. 1, a PTC substrate 10 comprising a first conductive layer 12, a second conductive layer 13 and a PTC material layer 11 sandwiched between the first conductive layer 12 and the second conductive layer 13. The PTC material layer 11 comprises crystalline polymer and conductive filler dispersed therein. The crystalline polymer may comprise polyethylene, polypropylene, polyoxymethylene, poly(ethylene oxide), poly(ethylene terephthalate), polyisobutylene, poly(ε-caprolactam), poly(hexamethylene adipamide), poly(vinyl fluoride), poly(vinylidene fluoride), polychlorotrifluoroethylene, polytetrafluoroethylene, poly(vinyl chloride), poly(vinylidene chloride), polystyrene, poly(acrylic acid), poly(vinyl acetate), polyacrylate, poly(methyl methacrylate), ionomer, and copolymer constituted of the monomers thereof. The conductive filler may be carbon black, graphite, metal powder, ceramic powder, and fiber-conductive material. Moreover, flame retardant may be further added to increase voltage endurance. The flame retardant may be halogen or phosphorous compound, metal hydroxide, metal oxide or nitride, such as aluminum hydroxide, magnesium hydroxide, zinc oxide, antimony oxide, or boron nitride. The conductive layer 12 and 13 may be metal foils such as copper foils, nickel foils or nickel-plated copper foils.

Figure 2:
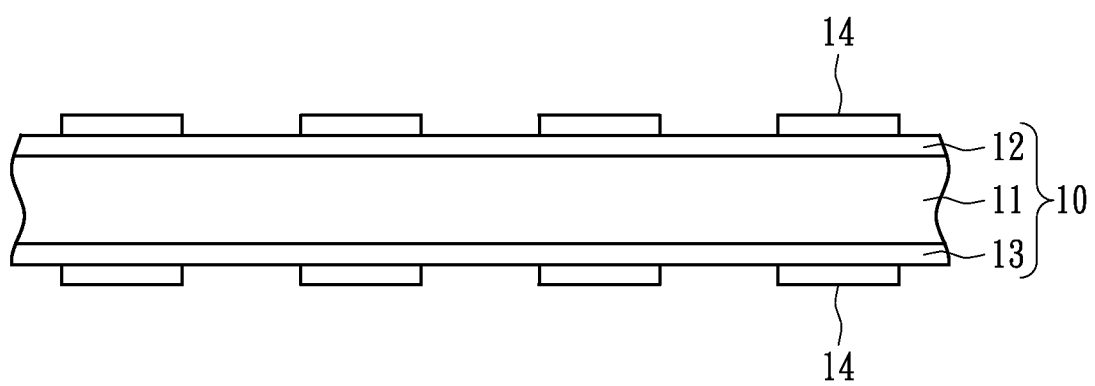

In FIG. 2, insulating layers 14 are formed on the first conductive layer 12 and the second conductive layer 13 at regular intervals. The insulating layers 14 may comprise rectangular insulating blocks made by solder mask printing process, and may have text mark thereon.

Figure 3:
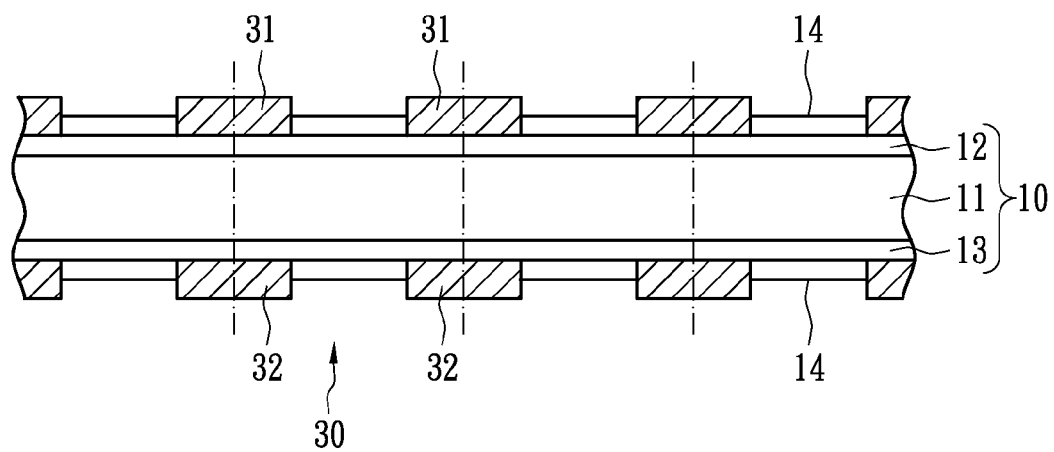
Figure 4:
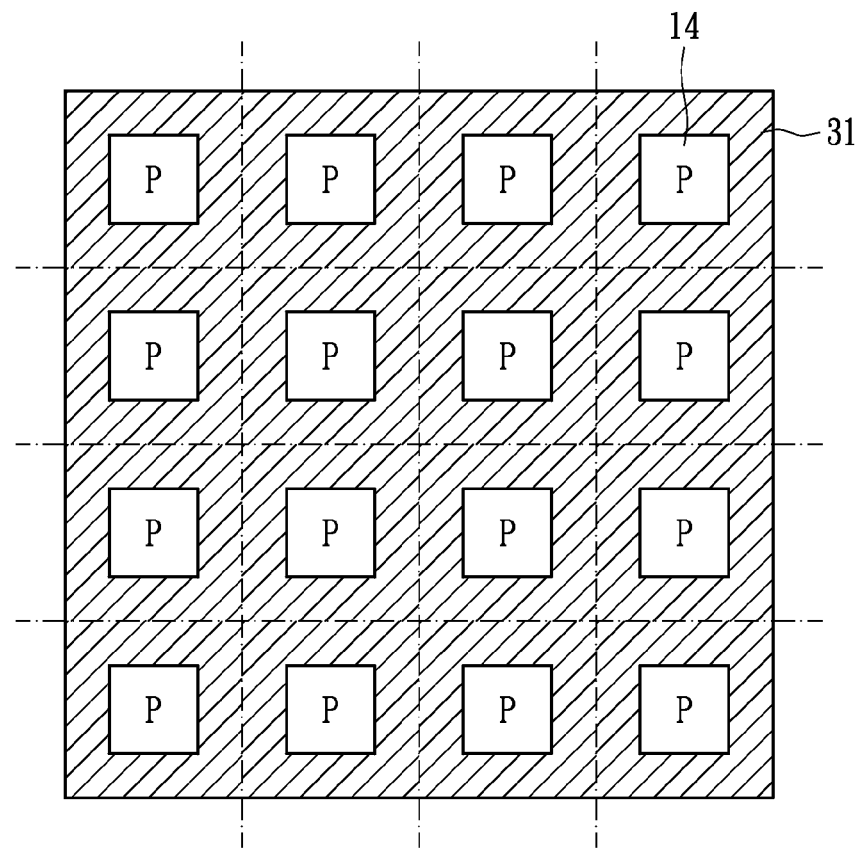

Referring to FIGS. 3 and 4, in which FIG. 4 is a top view of the device shown in FIG. 3, a first electrode 31 and a second electrode 32 are formed on the conductive layers 12 and 13 where are uncovered by the insulating layers 14. The first and second electrodes 12 and 13 are opposite to each other. In an embodiment, the conductive layers 12 and 13 uncovered by the insulating layers 14 are tin-plated, or the conductive layers 12 and 13 of copper foils are thickened before tin-plating, to form the first and second electrodes 31 and 32. The electrodes 31 and 32 may have the same thickness or are thicker than the insulating layers 14. Then the substrate is cut along the dash lines in FIGS. 3 and 4 to form a plurality of over-current protection device 30. If can be seen from FIG. 4 that the electrode 31 surrounds the insulating layers (blocks) 14, and indications "P" are marked thereon. In brief, a PTC substrate capable of withstanding high voltage is printed with insulating solder masks to define the solder mask area and tin-plating area, and then the solder masks are printed with texts. The exposed electrodes 31 and 32 may be electroplated with tin to increase the thickness; thereby the device 30 can stand stably and increase solderability.

More specifically, the over-current protection device 30 can withstand 60-600 volts, or preferably 90-600 volts, without damage, and comprises the PTC device 10, the electrodes 31 and 32, and the insulating layers 14. The PTC device 10 is a laminated structure comprising the first conductive layer 12, the second conductive layer 13 and the PTC material layer 11. The first conductive layer 12 is in physical contact with the first planar surface of the PTC material layer 11, and the second conductive layer 13 is in physical contact with the second planar surface of the PTC material layer 11. The first planar surface is opposite to the second planar surface. The first electrode 31 is disposed on the first conductive layer 12. The second electrode 32 is disposed on the second conductive layer 13 and is separated from the first electrode 31 by the PTC device 10.

Figure 5:
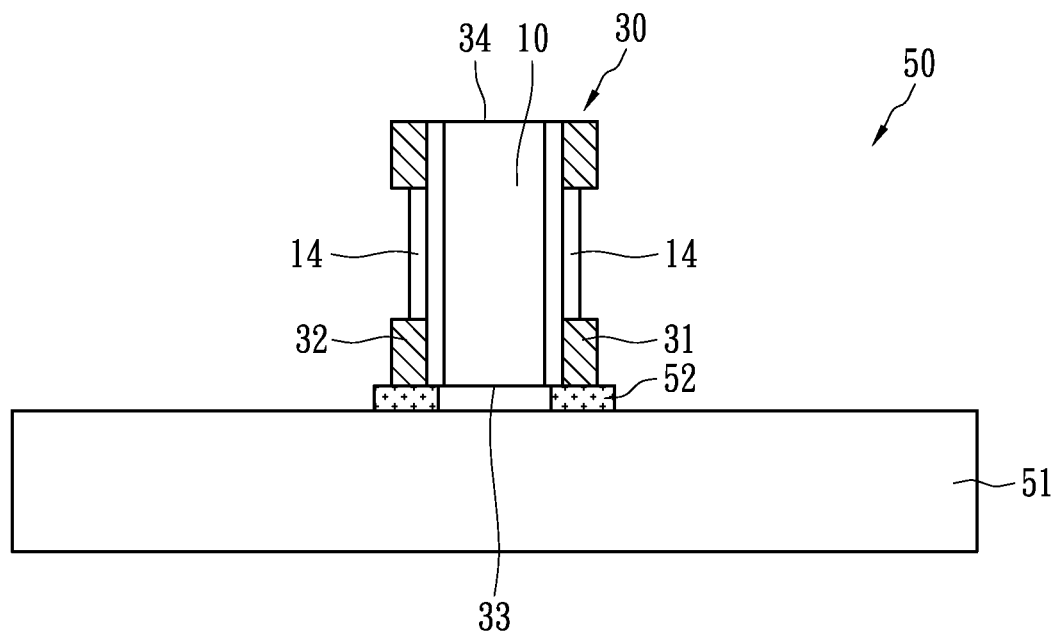
FIG. 5 shows a circuit board structure in accordance with an embodiment of the present application.

FIG. 5 shows an application of the over-current protection device, which also discloses a circuit board structure. In an embodiment, the over-current protection device 30 is surface-mounted and stands upright on a circuit board 51. The first electrode 31, the second electrode 32 and the PTC device 10 commonly form a planar end surface 33. The end surface 33 is substantially perpendicular to the first and second planar surfaces and faces the circuit board 51. The first and second electrodes 31 and 32 at the end surface 33 are surface-amounted to the circuit board 51 through solders 52 to electrically connect to a circuitry of the circuit board 51. Another end surface 34 is opposite to the end surface 33, and is constituted of the first electrode 31, the second electrode 32 and the PTC device 10 also. The over-current protection device 30 is a symmetrical structure, and therefore it is not necessary to consider the orientation of the device 30 when surface-mounting. In an embodiment, the assembly of the PTC device 10, the first and second electrodes 31 and 32 has a total thickness ranging from 1.5 to 2.8 mm, or may be 1.8 mm, 2 mm or 2.5 mm. The length of the PTC device 10, i.e., the height of the device 30 in an upright position, ranges from 2 mm to 8 mm, or may be 4 mm or 6 mm in particular.

The right side view of the over-current protection device 30 in FIG. 5 may refer to a single over-current protection device shown in FIG. 4; that is, the electrode 31 surrounds the insulating blocks 14. Alternatively, the first electrode 31 and the second electrode 32 in side view may be of other arrangements like those shown in FIGS. 6 to 8.

Figure 6:
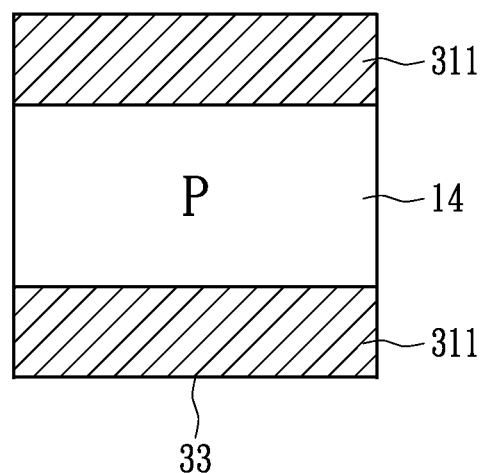
FIGS. 6 to 8 show the over-current protection devices in side view in accordance with some embodiments of the present application.

In FIG. 6, the first electrode 31 is disposed on a planar surface of the PTC material layer 10 and comprises two first electrode layers 311 separated by the insulating layer 14. Likewise, the second electrode 32 is disposed on another planar surface of the PTC material layer 10 and comprises two second electrode layers (not shown) separated by another insulating layer 14. The first electrode layers 311 and the second electrode layers are symmetrical. The lower first electrode layer 311 and the second electrode layer and the PTC device 10 constitute a planar end surface 33. The planar end surface 33 faces the circuit board 51 in FIG. 5 when the device 30 is soldered to the circuit board 51.

Figure 7:
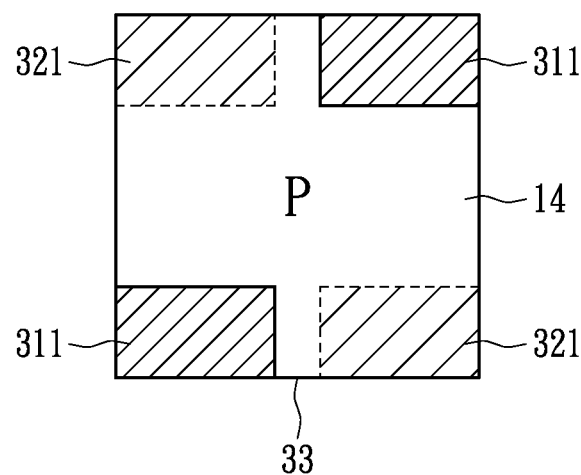

In FIG. 7, two first electrode layers 311 are diagonally placed on a rectangular surface of the PTC device 10, and two second electrode layers 321 are diagonally placed on another surface of the PTC device 10. The lower first electrode layer 311 and the second electrode layer 321 and the PTC device 10 constitute a planar end surface 33. The planar end surface 33 faces the circuit board 51 in FIG. 5 when the device 30 is soldered to the circuit board 51. In this embodiment, the first electrode layer 311 and the second electrode layer 321 are diagonal to each other on the planar end surface 33. In other words, it is a longer distance between the lower first electrode layer 311 and the lower second electrode layer 321, thereby providing better voltage endurance performance.

Figure 8:
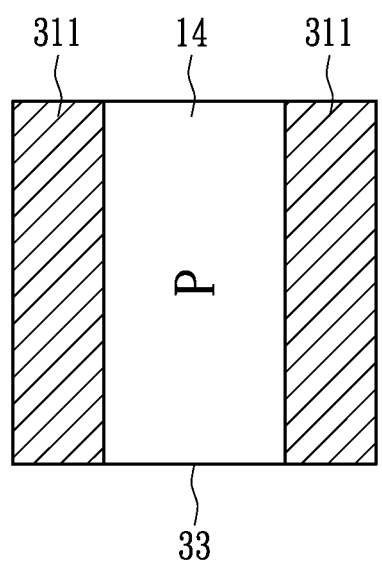

In FIG. 8, the device is like the device in FIG. 6 which rotates 90 degrees counterclockwise. The first electrode 31 is disposed on a planar surface of the PTC material layer 10 and comprises two first electrode layers 311 isolated by the insulating layer 14. Likewise, the second electrode 32 is disposed on another planar surface of the PTC material layer 10 and comprises two second electrode layers (not shown) isolated by another insulating layer 14. The first electrode layers 311 and the second electrode layers are symmetrical. The bottom of the two first electrode layers 311, the bottom of the two second electrode layer and the PTC device 10 constitute a planar end surface 33. The planar end surface 33 faces the circuit board 51 in FIG. 5 when the device 30 is soldered to the circuit board 51. It is preferably to use diagonal first and second electrode layers on the end surface 33 as soldering interlaces. In view of the longer distance from the first electrode layer to the second electrode layer, voltage endurance can be further improved.

In an embodiment, another insulating layer may be formed on the end surface 33 where the PTC device 10 locates, so as to avoid soldering wicking and thereby increase voltage endurance. Another end surface 34 may be overlaid by an insulating layer as well, and as a consequence there is no need to consider the orientation of the device when soldering.

The above-described embodiments of the present invention are intended to be illustrative only. Numerous alternative embodiments may be devised by persons skilled, in the art without departing from the scope of the following claims.

We claim:

1. An over-current protection device adapted to be surface-mounted on a circuit board and capable of withstanding 60 to 600 volts, the over-current protective device comprising: a PTC device having a laminated structure, the PTC device comprising a first conductive layer, a second conductive layer and a PTC material layer, the first conductive layer being in physical contact with a first planar surface of the PTC material layer, the second conductive layer being in physical contact with a second planar surface of the PTC material layer, the second planar surface being opposite to the first planar surface; a first electrode disposed on the first conductive layer; and a second electrode disposed on the second conductive layer; and being separated from the first electrode; wherein the first electrode, the second electrode and the PTC device commonly form an end surface substantially perpendicular to the first and second planar surfaces, wherein the first and second electrodes at the end surface serve as interfaces soldering onto to the circuit board; wherein the end surface faces the circuit board when the over-current protection device is surface-mounted to the circuit board and when the first planar surface and the second planar surface are perpendicular to the circuit board when the over-current protection device is surface-mounted to the circuit board.

2. The over-current protection device of claim 1, further comprising:
a first insulating layer disposed on the first planar surface; and
a second insulating layer disposed on the second planar surface;
wherein the first electrode surrounds the first insulating layer as a ring and the second electrode surrounds the second insulating layer as a ring.

3. The over-current protection device of claim 1, wherein the first electrode comprises two first electrode layers, the second electrode comprises two second electrode layers, one of the first electrode layers, one of the second electrode layers and the PTC device forming the end surface.

4. The over-current protection device of claim 3, wherein another first electrode layer, another second electrode layer and the PTC device form another end surface opposite to the end surface.

5. The over-current protection device of claim 3, further comprising:
a first insulating layer disposed on the first conductive layer between the two first electrode layers; and
a second insulating layer disposed on the second conductive layer between the two second electrode layers.

6. The over-current protection device of claim 5, wherein the first and second insulating layers are solder masks.

7. The over-current protection device of claim 1, wherein the first and second electrodes are diagonally placed on the end surface.

8. The over-current protection device of claim 1, wherein a total thickness of the PTC device, the first electrode and the second electrode ranges from 1.5 to 2.8 mm, and the PTC device has a length from 2 to 8 mm.

9. A circuit board structure; comprising: a circuit board, and an over-current protection device capable of withstanding 60 to 600 volts and being surface-mounted on the circuit board in an upright position, the over-current protection device comprising a PTC device, a first electrode and a second electrode, the PTC device comprising a first conductive layer, a second conductive layer and a PTC material layer, the first conductive layer being in physical contact with a first planar surface of the PTC material layer, the second conductive layer being in physical contact with a second planar surface of the PTC material layer, the second planar surface being opposite to the first planar surface, the first electrode being disposed on the first conductive layer, the second electrode being disposed on the second conductive layer and separated from the first electrode; wherein the first electrode, the second electrode and the PTC device commonly form an end surface substantially perpendicular to the first and second planar surfaces, the first and second electrodes at the end surface serve as interfaces soldering onto to the circuit board; wherein the end surface faces the circuit board, and wherein the first planar surface and the second planar surface are perpendicular to the circuit board.

10. The circuit board structure of claim 9, further comprising:
a first insulating layer disposed on the first planar surface; and
a second insulating layer disposed on the second planar surface;
wherein the first electrode surrounds the first insulating layer as a ring and the second electrode surrounds the second insulating layer as a ring.

11. The circuit board structure of claim 9, wherein the first electrode comprises two first electrode layers, the second electrode comprises two second electrode layers, one of the first electrode layers, one of the second electrode layers and the PTC device form the end surface.

12. The circuit board structure of claim 11, further comprising:
a first solder mask disposed on the first conductive layer between the two first electrode layers; and
a second solder mask disposed on the second conductive layer between the two second electrode layers.

13. The circuit board structure of claim 9, wherein a total thickness of the PTC device, the first electrode and the second electrode ranges from 1.5 to 2.8 mm, and the PTC device has a length from 2 to 8 mm.

* * * * *